US012695193B2

(12) United States Patent
Ishizaki et al.

(10) Patent No.: US 12,695,193 B2
(45) Date of Patent: Jul. 28, 2026

(54) ANTENNA MODULE

(71) Applicant: TOKIN CORPORATION, Shiroishi (JP)

(72) Inventors: Toshiya Ishizaki, Shiroishi (JP); Norimitsu Hoshi, Shiroishi (JP); Yoshihiro Saito, Shiroishi (JP); Katsuaki Tamashiro, Shiroishi (JP)

(73) Assignee: TOKIN CORPORATION, Shiroishi (JP)

( * ) Notice: Subject to any disclaimer, the term of this patent is extended or adjusted under 35 U.S.C. 154(b) by 0 days.

(21) Appl. No.: 19/146,781

(22) PCT Filed: Nov. 5, 2024

(86) PCT No.: PCT/JP2024/039327
§ 371 (c)(1),
(2) Date: Jul. 9, 2025

(87) PCT Pub. No.: WO2025/100414
PCT Pub. Date: May 15, 2025

(65) Prior Publication Data
US 2026/0112813 A1 Apr. 23, 2026

(30) Foreign Application Priority Data
Nov. 10, 2023 (JP) ................................. 2023-192242

(51) Int. Cl.
*H01Q 7/00* (2006.01)
*H05K 1/189* (2026.01)

(52) U.S. Cl.
CPC ............... *H01Q 7/00* (2013.01); *H05K 1/189* (2013.01); *H05K 2201/10098* (2013.01)

(58) Field of Classification Search
CPC . H01Q 7/00; H05K 1/189; H05K 2201/10098
See application file for complete search history.

(56) References Cited

U.S. PATENT DOCUMENTS 7,545,336 B2 * 6/2009 Naito ........................ H01Q 7/08
343/788
2018/0090975 A1 * 3/2018 Lee ......................... H01F 38/14

FOREIGN PATENT DOCUMENTS

| | | |
|---|---|---|
| JP | 2006339757 A | 12/2006 |
| JP | 2017098936 A | 6/2017 |

(Continued)

OTHER PUBLICATIONS

International Search Report (ISR) (and an English translation thereof) dated Jan. 21, 2025, issued in International Application No. PCT/JP2024/039327.

(Continued)

*Primary Examiner* — David E Lotter
(74) *Attorney, Agent, or Firm* — Holtz, Holtz & Volek PC

(57) ABSTRACT

In an antenna module, a supporting member has an outer wall and an inner wall which form an accommodation groove. A main portion of the coil is accommodated in the accommodation groove of the supporting member at least in part. End portions of the coil are connected to an FP. A lead portion of the FP is laid out to an outside of the supporting member. The supporting member has a first flange portion protruding from the outer wall in a first orientation and a second flange portion protruding from the outer wall in a second orientation. A part of the main portion of the coil is located under each of the first flange portion and the second flange portion when viewed from above. A magnetic sheet is attached to an upper part of the outer wall so that the magnetic sheet covers partly the main portion of the coil.

9 Claims, 9 Drawing Sheets

(56)        References Cited

FOREIGN PATENT DOCUMENTS

| | | | |
|---|---|---|---|
| JP | 2020188453 | A | 11/2020 |
| JP | 2022036513 | A | 3/2022 |

OTHER PUBLICATIONS

Japanese Decision to Grant a Patent (and an English language translation thereof) dated Oct. 30, 2024, issued in Japanese Application No. 2023-192242.
Written Opinion dated Jan. 21, 2025, issued in International Application No. PCT/JP2024/039327.

* cited by examiner

1

ANTENNA MODULE

TECHNICAL FIELD

This invention relates to an antenna module.

BACKGROUND ART

An antenna module (an antenna coil) disclosed in Patent Document 1 is provided with a coil (a coil body), a magnetic sheet (a resin-bonded soft magnetic body) and a supporting member (a coil case).

In the antenna module of Patent Document 1, the supporting member has a frame shape and an accommodation portion formed in a groove shape along an outer shape of the supporting member. And, in the accommodation portion, the magnetic sheet and the coil are accommodated. The magnetic sheet is located at a bottom side of the accommodation portion, and the coil is located upward of the magnetic sheet or at an opening side of the accommodation portion.

PRIOR ART DOCUMENTS

Patent Document(s)

Patent Document 1: JP2006-339757A

SUMMARY OF INVENTION

Technical Problem

In the antenna module of Patent Document 1, the magnetic sheet is located under the coil. However, there is a request to provide the magnetic sheet upward of the coil in consideration of a usage state of the antenna module.

Moreover, the antenna module of Patent Document 1 is connected to the outside thereof by the use of coil-side terminals provided on the coil case. However, there is also a request to use a flexible printed circuit board (FPC) to connect the coil to the outside.

In addition, when the FPC is used, there is a request to connect the FPC to the coil before attaching the coil to the supporting member.

It is an object of the present invention to provide an antenna module which meets the above requests and can exhibit desired antenna characteristics.

Solution to Problem

One aspect of the present invention provides an antenna module comprising a supporting member, a coil, a flexible printed circuit board and a magnetic sheet, wherein:

the coil has a main portion and end portions;

the end portions are connected to the flexible printed circuit board;

the flexible printed circuit board has a lead portion;

the supporting member has an outer wall and an inner wall which form an accommodation groove and has at least one first flange portion and at least one second flange portion;

the at least one first flange portion protrudes from the outer wall in a first orientation perpendicular to an up-down direction;

the at least one second flange portion protrudes from the outer wall in a second orientation which is opposite to the first orientation;

the main portion of the coil is accommodated in the accommodation groove at least in part;

the lead portion of the flexible printed circuit board is laid out to an outside of the supporting member in part in a third orientation perpendicular to the up-down direction and perpendicular to both the first orientation and the second orientation;

a part of the main portion of the coil is located under each of the first flange portion and the second flange portion when viewed from above; and the magnetic sheet is attached to an upper part of the outer wall so that the magnetic sheet covers partly the main portion of the coil.

Advantageous Effects of Invention

According to one aspect of the present invention, it is possible to provide the antenna module which is provided with the flexible printed circuit board (FPC) connected to the coil and the main portion of the coil covered by the magnetic sheet and which has desired antenna characteristics.

An appreciation of the objectives of the present invention and a more complete understanding of its structure may be had by studying the following description of the preferred embodiment and by referring to the accompanying drawings.

DESCRIPTION OF EMBODIMENTS

Figure 1:
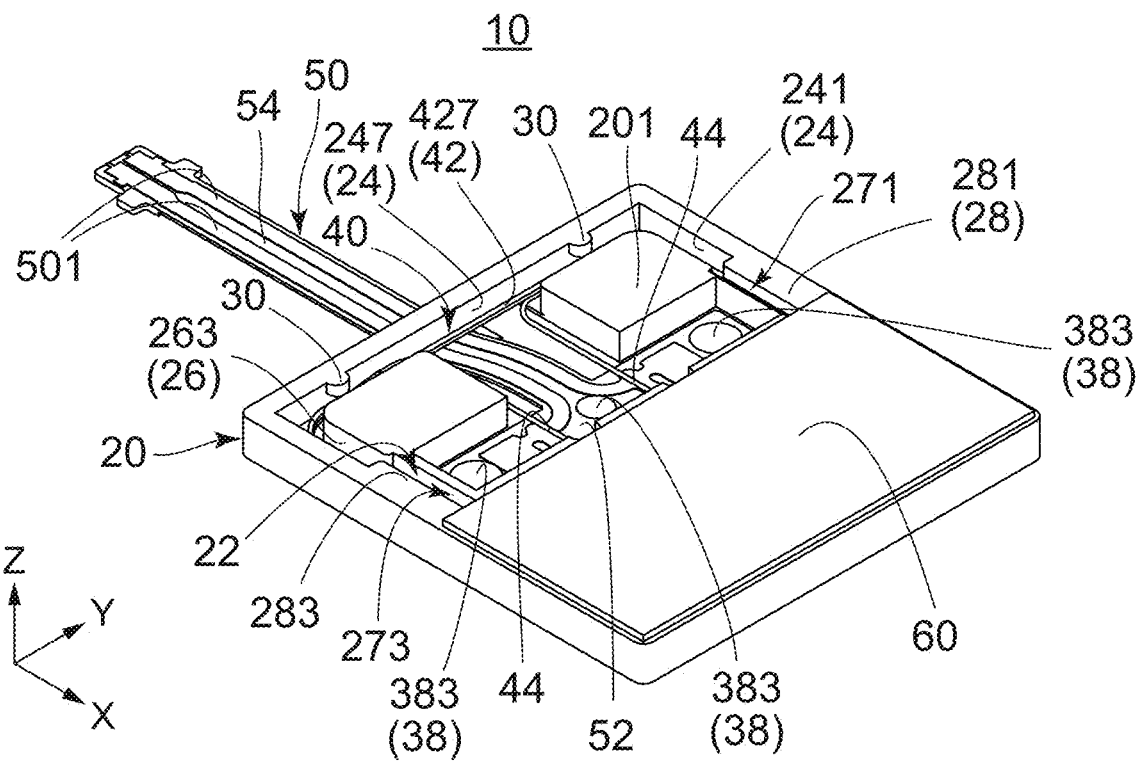
FIG. 1 is a perspective view showing an antenna module according to an embodiment of the present invention. End portions of a coil are not connected to connection pads of an FPC.

While the invention may be realized in various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Referring to FIG. 1, an antenna module 10 according to an embodiment of the present invention is provided with a supporting member 20, a coil 40, a flexible printed circuit board (hereinafter referred to as FPC) 50 and a magnetic sheet 60.

Figure 2:
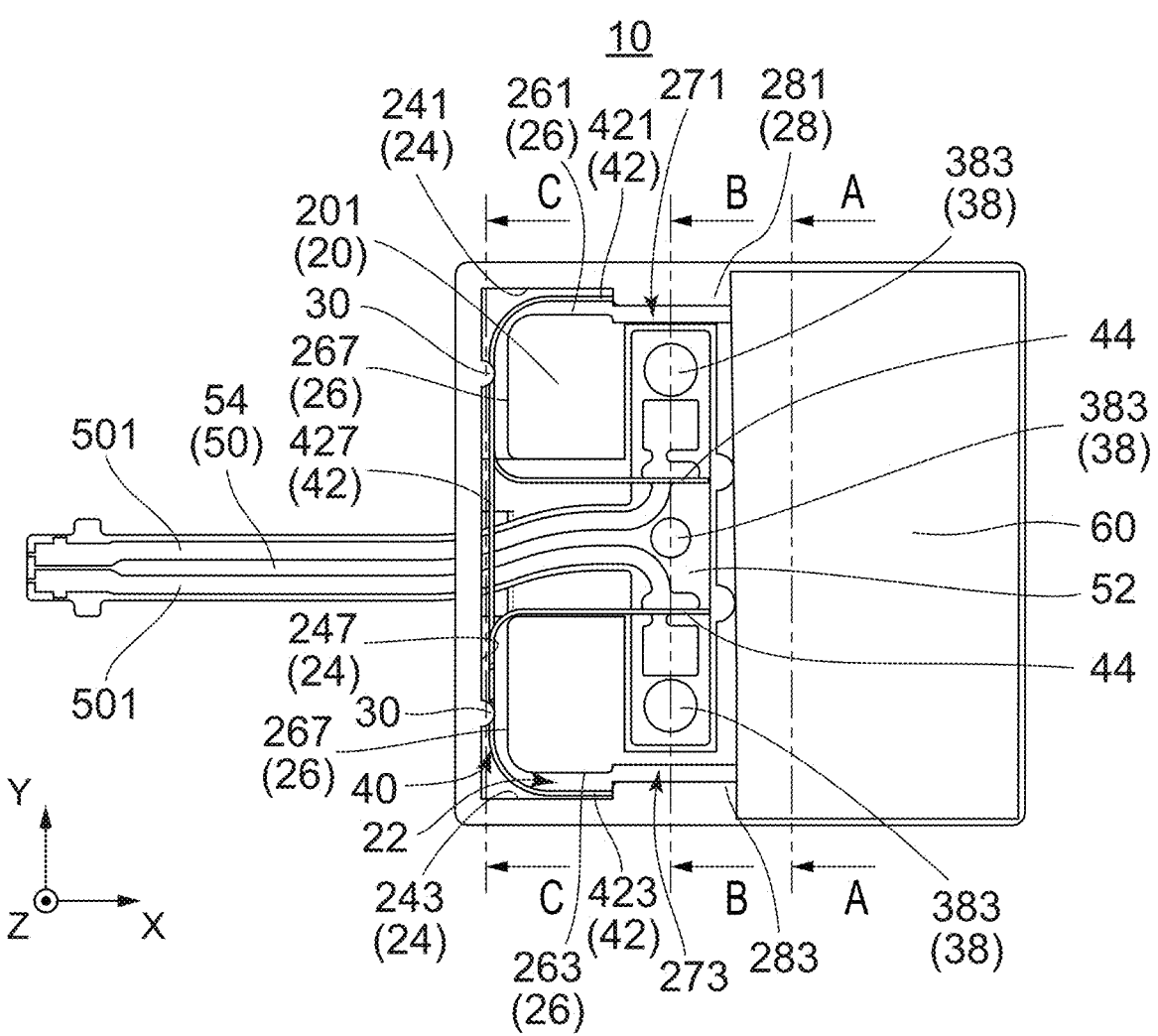
FIG. 2 is a plan view showing the antenna module of FIG. 1.
Figure 3:
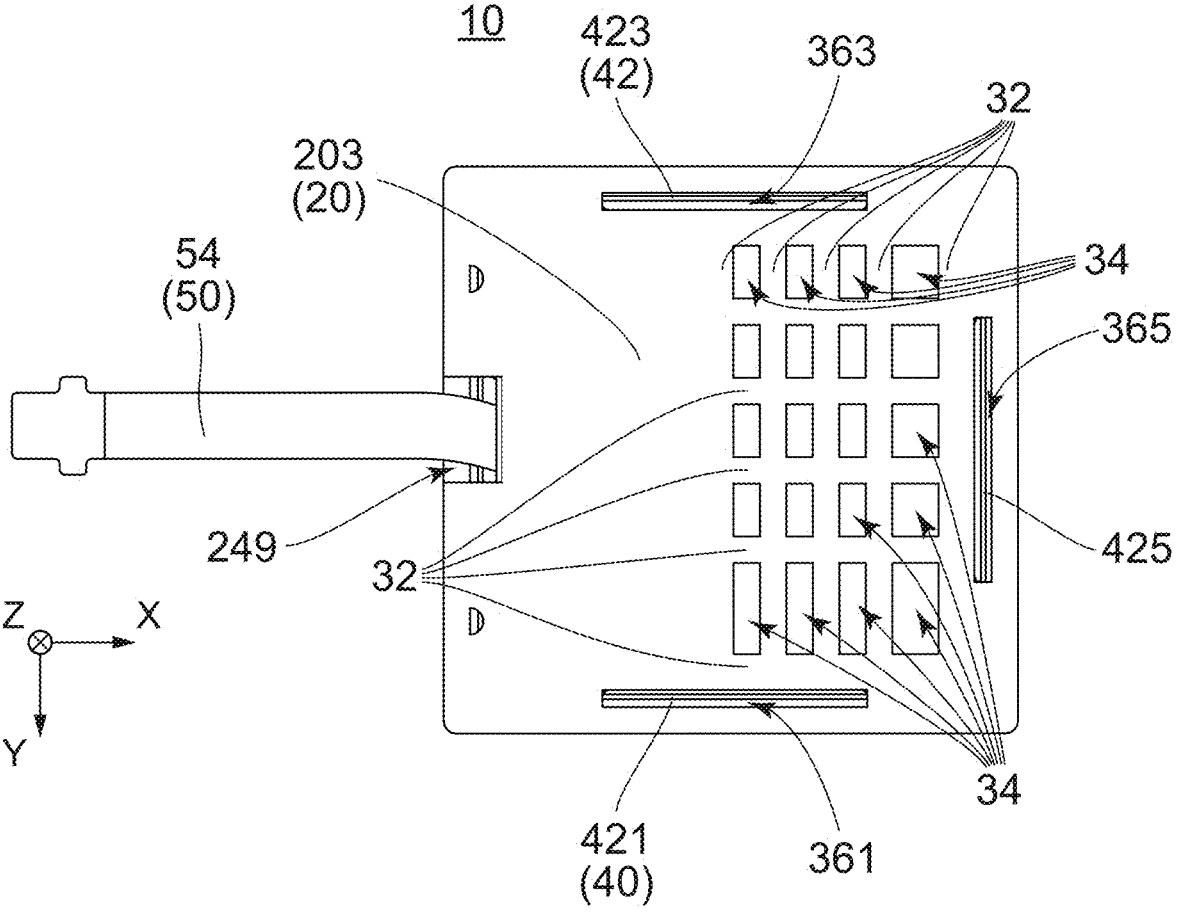
FIG. 3 is a bottom view showing the antenna module of FIG. 1.
Figure 7:
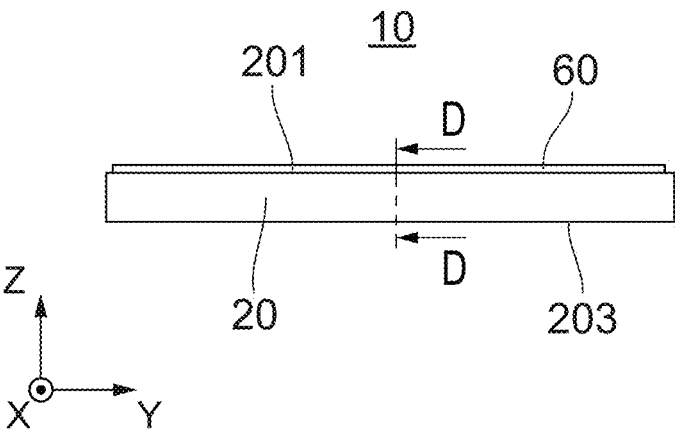
FIG. 7 is a front view showing the antenna module of FIG. 1.

As understood from FIGS. 2, 3 and 7, the supporting member 20 has an approximate plate shape and has an upper surface 201 perpendicular to an up-down direction and a lower surface 203 on the opposite side of the upper surface 201. The supporting member 20 is made of insulation resin, for example. In the present embodiment, the up-down direction is a Z-direction. A positive Z-direction is directed upward while a negative Z-direction is directed downward. Incidentally, the up-down direction in this specification is defined for convenience of explanation and does not necessarily coincide with the vertical direction.

As shown in FIGS. 2 and 3, in the present embodiment, the supporting member 20 has an approximately rectangular shape when viewed from above. However, the present invention is not limited thereto. The shape of the supporting member 20 is not particularly limited, but may be another shape, such as a circle or a racetrack shape, when viewed from above.

Figure 9:
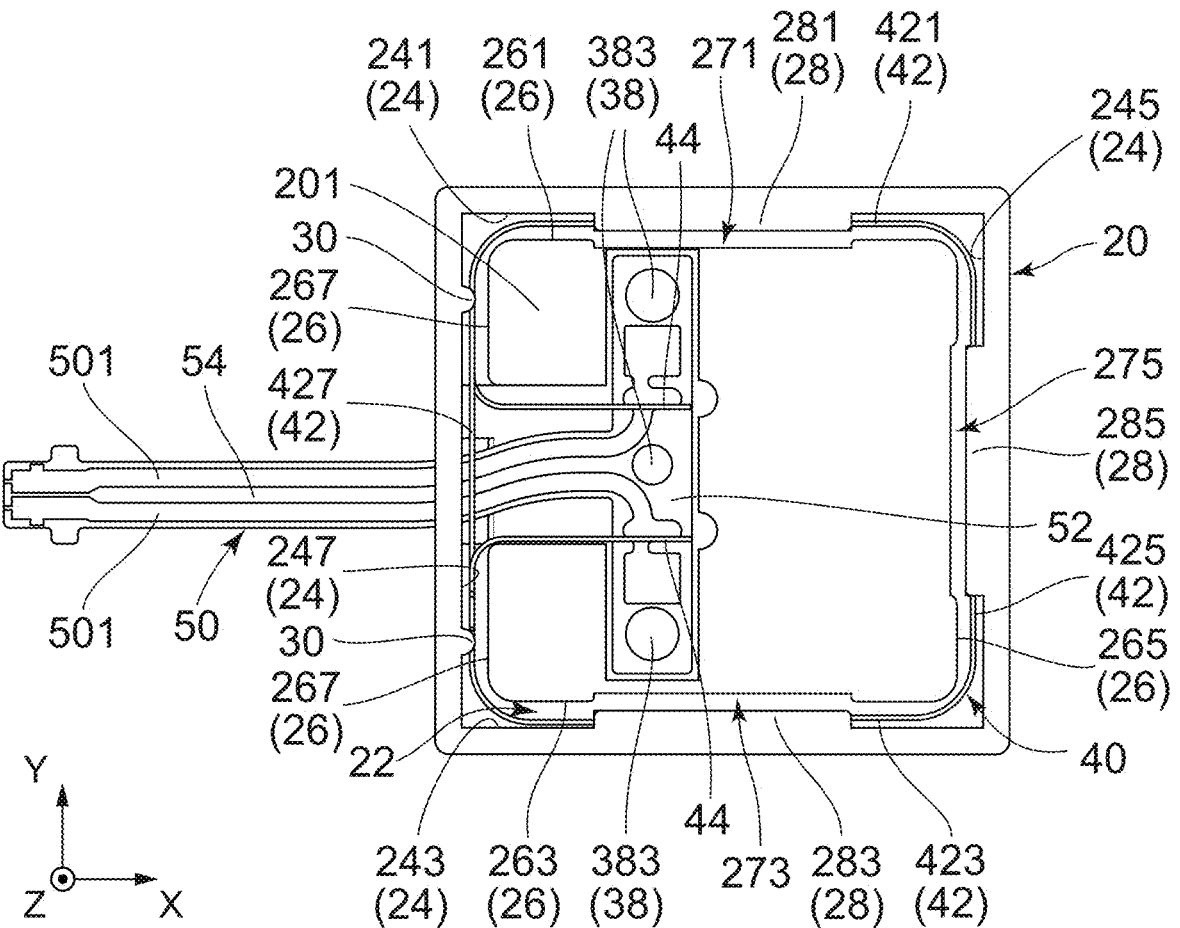
FIG. 9 is a plan view showing a state in which a magnetic sheet is removed from the antenna module of FIG. 1.

Referring to FIG. 9, an accommodation groove 22 is formed in the upper surface 201 of the supporting member 20. In detail, the supporting member 20 has an outer wall 24 and an inner wall 26 which form the accommodation groove 22. In the present embodiment, the accommodation groove 22 is formed along an outer shape of the supporting member 20 and has a rectangular ring shape. A size of a width of the accommodation groove 22 is larger than a size of a diameter of a coated conducting wire of the coil 40. For example, when the diameter of the coated conductive wire is 0.18 mm, the width of the accommodation groove 22 may be 0.2 mm-1.275 mm.

As shown in FIG. 9, in the present embodiment, the outer wall 24 of the supporting member 20 has a first outer wall portion 241 and a second outer wall portion 243 which extend in a first horizontal direction and has a third outer wall portion 245 and a fourth outer wall portion 247 which extend in a second horizontal direction perpendicular to the first horizontal direction. The third outer wall portion 245 connects one end portions of the first outer wall portion 241 and the second outer wall portion 243 to each other. Moreover, the fourth outer wall portion 247 connects the other end portions of the first outer wall portion 241 and the second outer wall portion 243 to each other. In the present embodiment, the first horizontal direction is an X-direction, and the second horizontal direction is a Y-direction.

As shown in FIG. 9, the inner wall 26 has a first inner wall portion 261 and a second inner wall portion 263 which extend in the first horizontal direction and has a third inner wall portion 265 and a pair of fourth inner wall portions 267 which extend in the second horizontal direction. The first inner wall portion 261 faces the first outer wall portion 241 and partly defines the accommodation groove 22 together with the first outer wall portion 241. The second inner wall portion 263 faces the second outer wall portion 243 and partly defines the accommodation groove 22 together with the second outer wall portion 243. The third inner wall portion 265 faces the third outer wall portion 245 and partly defines the accommodation groove 22 together with the third outer wall portion 245. The fourth inner wall portions 267 face the fourth outer wall portion 247 and partly define the accommodation groove 22 together with the fourth outer wall portion 247.

As understood from FIG. 9, the coil 40 has a main portion 42 formed by winding the coated conducting wire and a pair of end portions 44 extending from the main portion 42. The main portion 42 of the coil 40 is accommodated in the accommodation groove 22 of the supporting member 20 at least in part. The end portions 44 of the coil 40 are laid out to an inner peripheral side of the main portion 42 and connected to the FPC 50. In the present embodiment, the main portion 42 has a rounded rectangular shape when viewed from above and has a first side portion 421, a second side portion 423, a third side portion 425 and a fourth side portion 427. However, the present invention is not limited thereto. The shape of the main portion 42 may be another shape, such as a circle or a racetrack shape, when viewed from above.

As shown in FIG. 9, the supporting member 20 has a plurality of flange portions 28. In detail, the supporting member 20 has at least one first flange portion 281, at least one second flange portion 283 and at least one third flange portion 285. These flange portions 28 protrude over the accommodation groove 22 and make it difficult for the main portion 42 of the coil 40 to come out from the accommodation groove 22. Although a protruding amount of each of the flange portions 28 depends on the width of the accommodation groove 22, it is equal to 0.2 mm-0.8 mm when the diameter of the coated conductive wire is equal to 0.18 mm, for example.

As shown in FIG. 9, the at least one first flange portion 281 protrudes toward the inner wall 26 from the outer wall 24. In detail, the at least one first flange portion 281 protrudes from the outer wall 24 in a first orientation perpendicular to the up-down direction. In the present embodiment, the first flange portion 281 protrudes from the first outer wall portion 241 in the first orientation. In the present embodiment, the first orientation is the negative Y-direction. Moreover, in the present embodiment, the number of the first flange portion 281 is one. However, the present invention is not limited thereto. The first flange portions 281 may be two or more in number.

As shown in FIG. 9, the at least one second flange portion 283 also protrudes toward the inner wall 26 from the outer wall 24. In detail, the at least one second flange portion 283 protrudes from the outer wall 24 in a second orientation opposite to the first orientation. In the present embodiment, the second flange portion 283 protrudes from the second outer wall portion 243 in the second orientation. In the present embodiment, the second orientation is the positive Y-direction. Moreover, in the present embodiment, the number of the second flange portion 283 is one. However, the present invention is not limited thereto. The number of the second flange portions 283 may be two or more. Moreover, the number of the second flange portions 283 may be different from the number of the first flange portions 281.

As shown in FIG. 9, the at least one third flange portion 285 also protrudes toward the inner wall 26 from the outer wall 24. In detail, the at least one third flange portion 285 protrudes from the outer wall 24 in a third orientation perpendicular to the up-down direction and to both the first orientation and the second orientation. In the present embodiment, the third flange portion 285 protrudes from the third outer wall portion 245 in the third orientation. In the present embodiment, the third orientation is a negative X-direction. Moreover, in the present embodiment, the number of the third flange portion 285 is one. However, the present invention is not limited thereto. The number of the third flange portions 285 may be two or more. On the other hand, the third flange portion 285 is not essential in the present invention, so it may be omitted.

Figure 4:
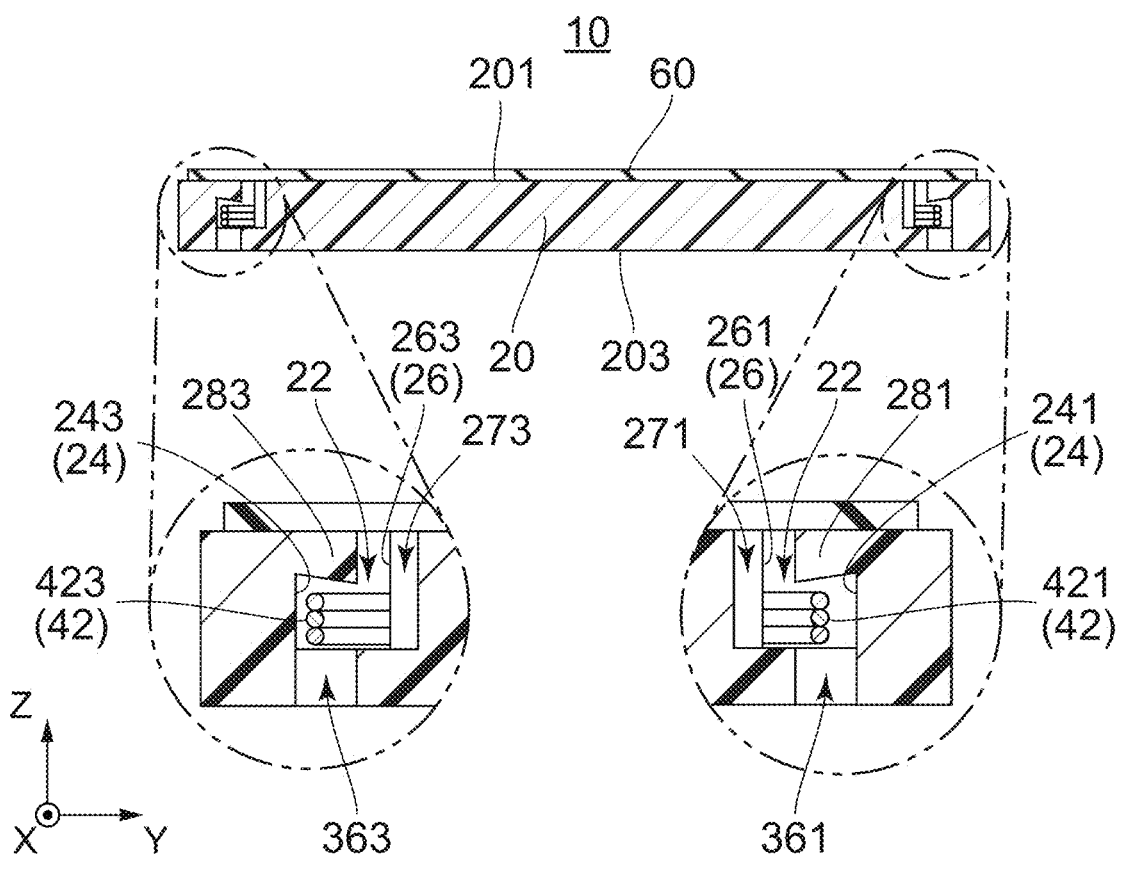
FIG. 4 is a cross-sectional view showing the antenna module of FIG. 2, taken along A-A line.

Referring to FIG. 4, a lower surface of the first flange portion 281 has a shape which goes down as it goes in the first orientation in a cross section along a plane defined by the first orientation (the negative Y-direction) and the up-down direction. Accordingly, when the main portion 42 of the coil 40 which is accommodated in the accommodation groove 22 is moved to come out from the accommodation groove 22, the main portion 42 of the coil 40 receives a force directed in the second orientation from the first flange portion 281, and it becomes difficult for the main portion 42 to come out from the accommodation groove 22. Similarly, a lower surface of the second flange portion 283 has a shape which goes down as it goes in the second orientation (the positive Y-direction) in a cross section along a plane defined by the second orientation and the up-down direction. Accordingly, when the main portion 42 of the coil 40 which is accommodated in the accommodation groove 22 is moved to come out from the accommodation groove 22, the main portion 42 of the coil 40 receives a force directed in the first orientation from the second flange portion 283, and it becomes difficult for the main portion 42 to come out from the accommodation groove 22. However, the present invention is not limited thereto. The first flange portion 281, in whole, may have a shape which goes down as it goes in the first orientation in the cross section along the plane defined by the first orientation and the up-down direction. Moreover, the second flange portion 283, in whole, may have a shape which goes down as it goes in the second orientation in the cross section along the plane defined by the second orientation and the up-down direction.

Figure 8:
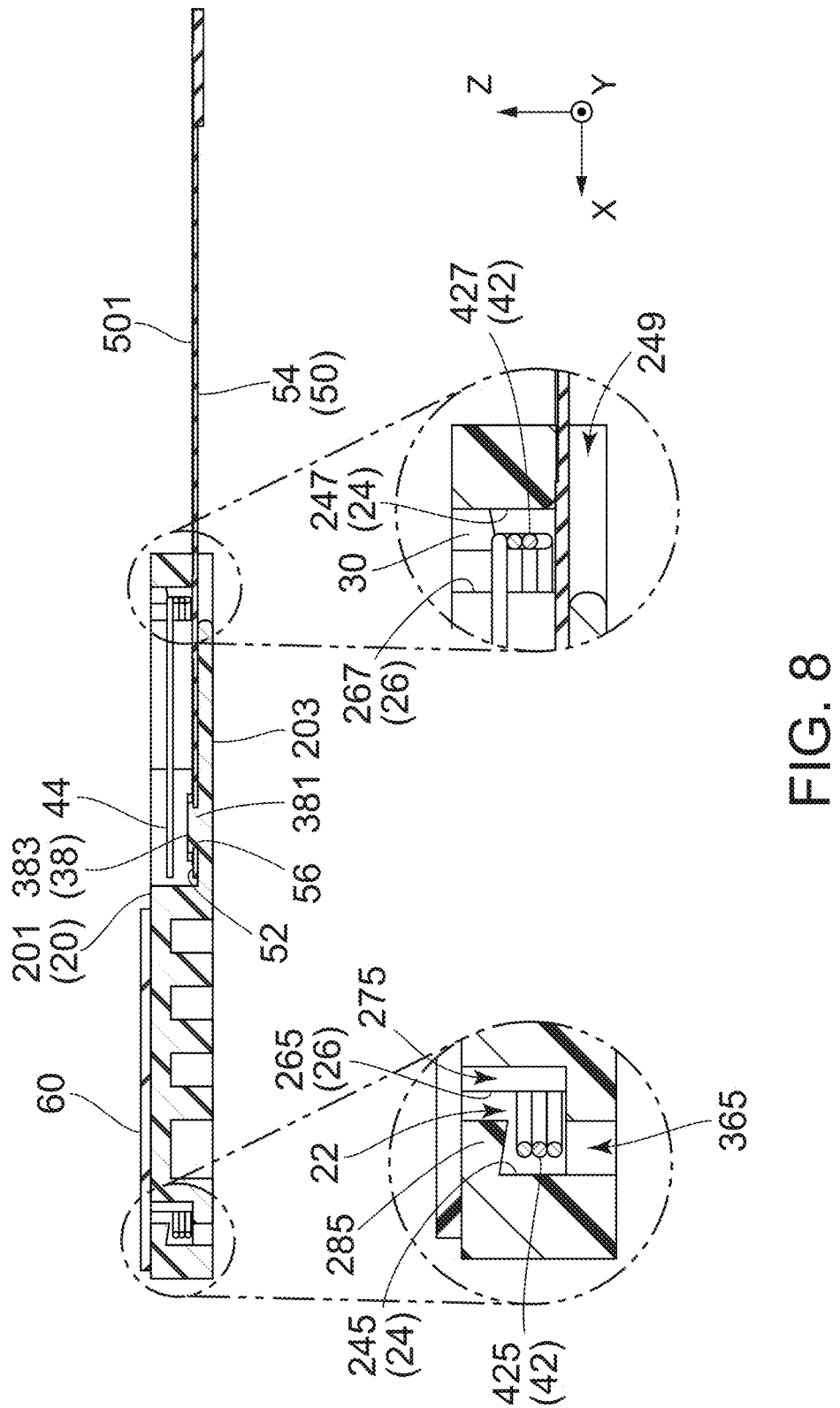
FIG. 8 is a cross-sectional view showing the antenna module of FIG. 7, taken along D-D line.

Referring to FIG. 8, a lower surface of the third flange portion 285 has a shape which goes down as it goes in the third orientation in a cross section along a plane defined by the third orientation (the negative X-direction) and the up-down direction. The third flange portion 285 also makes it difficult for the main portion 42 of the coil 40 to come out from the accommodation groove 22. However, the present invention is not limited thereto. The third flange portion 285, in whole, may have a shape which goes down as it goes in the third orientation in the cross section along the plane defined by the third orientation and the up-down direction in a manner, similarly to the first flange portion 281 or the second flange portion 283.

Figure 6:
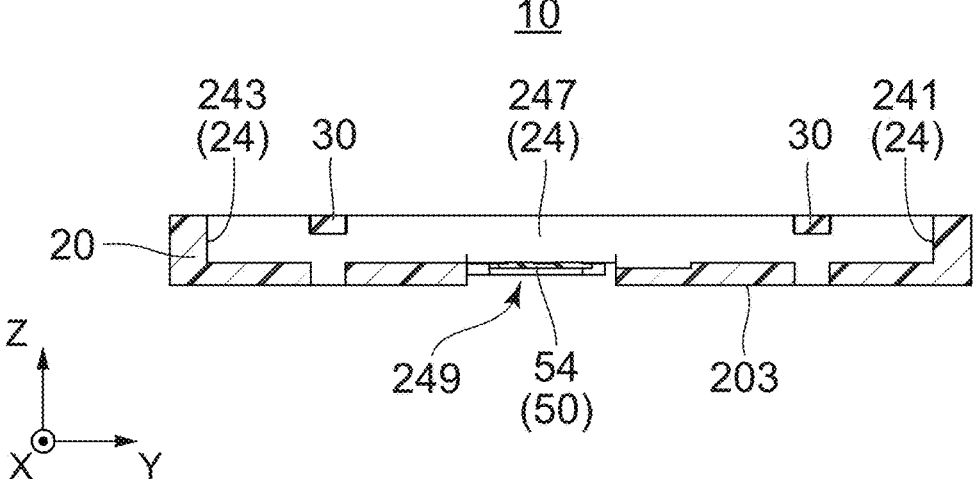
FIG. 6 is a cross-sectional view showing the antenna module of FIG. 2, taken along C-C line.

Referring to FIGS. 6 and 8, the supporting member 20 is provided with an opening portion 249 which communicates with the accommodation groove 22. The opening portion 249 is formed in a lower part of the outer wall 24. In the present embodiment, the opening portion 249 is formed in a lower part of the fourth outer wall portion 247. In addition, in the present embodiment, the opening portion 249 also extends into the lower surface 203.

As shown in FIG. 9, the supporting member 20 further has two protrusions 30. The protrusions 30 protrude toward the inner wall 26 from the outer wall 24. In detail, the protrusions 30 protrude from the outer wall 24 in a fourth orientation opposite to the third orientation. In the present embodiment, the protrusions 30 protrude from the fourth outer wall portion 247 of the outer wall 24 in the fourth orientation. In the present embodiment, the fourth orientation is a positive X-direction. Moreover, in the present embodiment, the two protrusions 30 are located at positions which sandwich the opening portion 249 (see FIGS. 6 and 8) in the second horizontal direction. In other words, the two protrusions 30 are located, in the second horizontal direction, at positions which sandwich a lead portion 54 of the FPC 50 laid out through the opening portion 249. Although a protruding amount of each of the protrusions 30 depends on the width of the accommodation groove 22, it is equal to 0.2 mm-0.8 mm when the diameter of the coated conductive wire is equal to 0.18 mm, for example. However, in the present invention, the protrusions 30 are not essential.

As shown in FIG. 8, a lower surface of the protrusion 30 has a shape which goes down as it goes in the fourth orientation in a cross section along a plane defined by the fourth orientation (the positive X-direction) and the up-down direction. The protrusions 30 also make it difficult for the main portion 42 of the coil 40 to come out from the accommodation groove 22. Each of the protrusions 30, in whole, may have a shape which goes down as it goes in the fourth orientation in the cross section along the plane defined by the fourth orientation and the up-down direction.

As shown in FIG. 9, the inner wall 26 of the supporting member 20 is provided with a first recessed portion 271, a second recessed portion 273 and a third recessed portion 275. The first recessed portion 271, the second recessed portion 273 and the third recessed portion 275 correspond to the first flange portion 281, the second recessed portion 273 and the third flange portion 285, respectively. In detail, the first recessed portion 271 is located at a side of the first orientation (the negative Y-direction) with respect to the first flange portion 281 corresponding thereto and recessed in the first orientation. Moreover, the second recessed portion 273 is located at a side of the second orientation (the positive Y-direction) with respect to the second flange portion 283 corresponding thereto and recessed in the second orientation. The third recessed portion 275 is located on a side of the third orientation (the negative X-direction) with respect to the third flange portion 285 corresponding thereto and recessed in the third orientation. The first recessed portion 271, the second recessed portion 273 and the third recessed portion 275 make it easy for the main portion 42 of the coil 40 to be accommodated in the accommodation groove 22. However, the third recessed portion 275 is not essential in the present invention.

Referring to FIG. 3, in the present embodiment, the lower surface 203 of the supporting member 20 is formed with a plurality of ribs 32 intersecting with one another and hollows 34 each of which is located between adjacent two of the ribs 32. The ribs 32 include ones extending in the first horizontal direction and ones extending in the second horizontal direction. Each of the hollows 34 has a rectangular shape when viewed from beneath and is recessed upward. Presence of the hollows 34 reduces the amount of necessary resin for forming the supporting member 20, so that cost reduction is achieved.

As shown in FIG. 3, in the present embodiment, the lower surface 203 of the supporting member 20 is formed with a first confirmation window 361, a second confirmation window 363 and a third confirmation window 365. The first confirmation window 361, the second confirmation window 363 and the third confirmation window 365 correspond to the first flange portion 281, the second flange portion 283 and the third flange portion 285, respectively. The first confirmation window 361, the second confirmation window 363 and the third confirmation window 365 are used for visually confirming the coil 40. In other words, the main portion 42 of the coil 40 which is accommodated in the accommodation groove 22 can be visually confirmed through each of the first confirmation window 361, the second confirmation window 363 and the third confirmation window 365.

As shown in FIG. 9, in the present embodiment, the FPC 50 has a T-shape when viewed from above. In detail, the FPC 50 has a connection portion 52 extending in the second horizontal direction and the lead portion 54 extending in the first horizontal direction. However, the present invention is not limited thereto. Provided that the FPC 50 has the lead portion 54, the shape thereof is not particularly limited.

As shown in FIG. 9, an upper surface of the FPC 50 is formed with a pair of conductive patterns 501. The conductive patterns 501 extend from the connection portion 52 to the lead portion 54. The end portions 44 of the coil 40 are connected to connection pads included in the conductive patterns 501.

Figure 5:
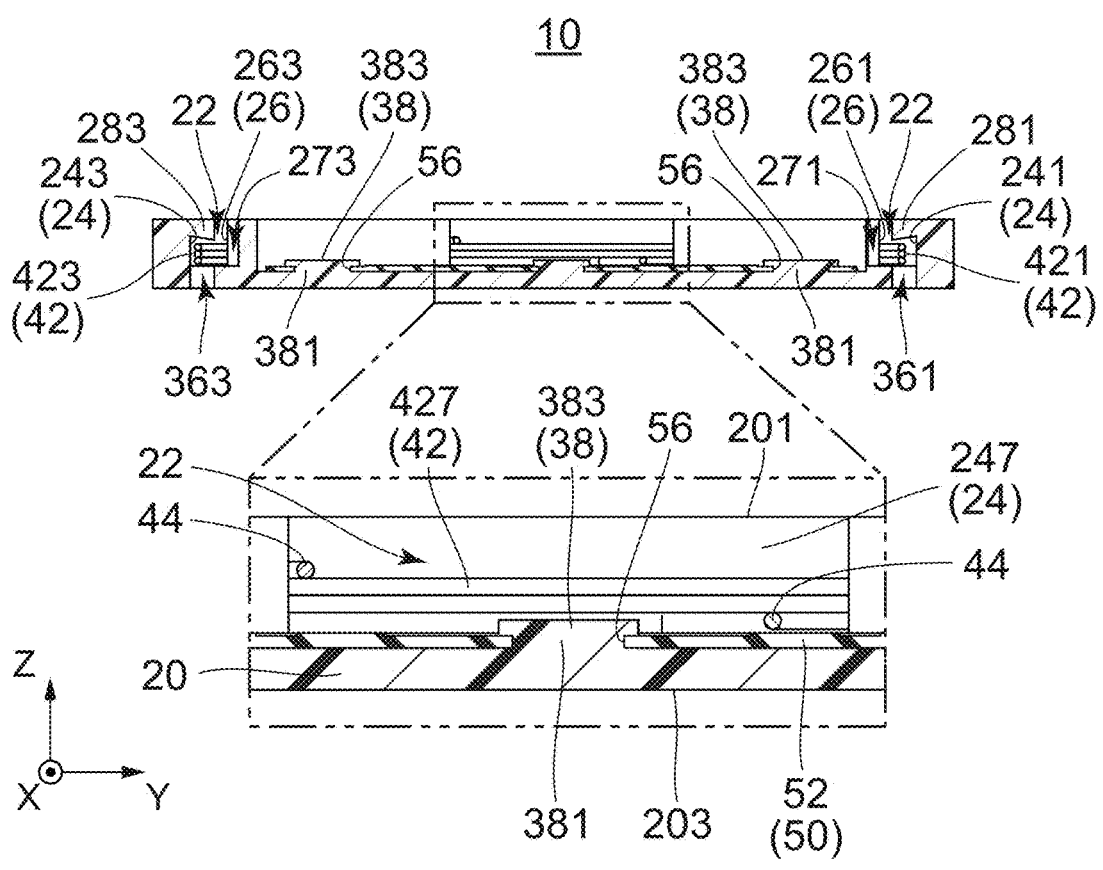
FIG. 5 is a cross-sectional view showing the antenna module of FIG. 2, taken along B-B line.

As understood from FIGS. 2, 5 and 8, the connection portion 52 of the FPC 50 is fixed to the supporting member 20. In the present embodiment, the connection portion 52 of the FPC 50 is fixed to the supporting member 20 by thermal caulking. The lead portion 54 of the FPC 50 is laid out to the outside of the supporting member 20 at least in part through the opening portion 249 formed in the supporting member 20. In the present embodiment, the lead portion 54 of the FPC 50 is laid out in the third orientation.

As shown in FIGS. 1, 2 and 7, the magnetic sheet 60 is a thin sheet with a rectangular shape when viewed from above. The magnetic sheet 60 is made of at least magnetic metal powder and binder (resin) which binds magnetic metal powder. The magnetic sheet 60 is attached to an upper part of the outer wall 24 so that the magnetic sheet 60 covers partly the main portion 42 of the coil 40.

Hereinafter, the description will be made about a manufacturing process for manufacturing the antenna module 10 mainly with reference to FIG. 9.

First, the supporting member 20, the coil 40, the FPC 50 and the magnetic sheet 60 are prepared.

Next, the end portions 44 of the coil 40 are soldered to connection pads of the FPC 50.

Next, the FPC 50 is attached to the supporting member 20. At this time, the lead portion 54 of the FPC 50 is laid out, in part, to the outside of the supporting member 20 in the third orientation (the negative X-direction) through the opening portion 249 (see FIG. 8) of the supporting member 20. Meanwhile, the fourth side portion 427 of the main portion 42 of the coil 40 is accommodated in the accommodation groove 22. By drawing the lead portion 54 of the FPC 50 in the third orientation, the fourth side portion 427 of the main portion 42 of the coil 40 becomes close to the fourth outer wall portion 247 of the outer wall 24 to be positioned under the protrusions 30 at least in part. Incidentally, the fourth inner wall portions 267 are not provided with the protrusions 30. Accordingly, when the fourth side portion 427 of the main portion 42 of the coil 40 is accommodated in the accommodation groove 22, the coil 40 is not pressed onto the protrusions 30, and a coating thereof is not damaged.

Figure 10:
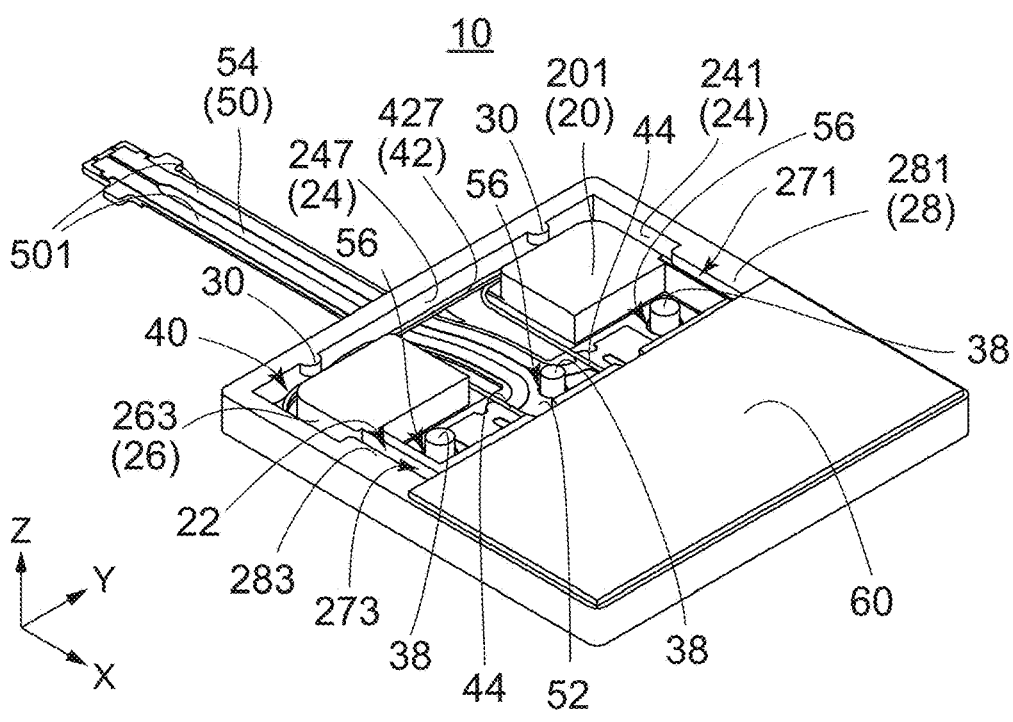
FIG. 10 is a perspective view showing the antenna module of FIG. 1 in a state before holding portions of a supporting member are applied with thermal caulking.
Figure 11:
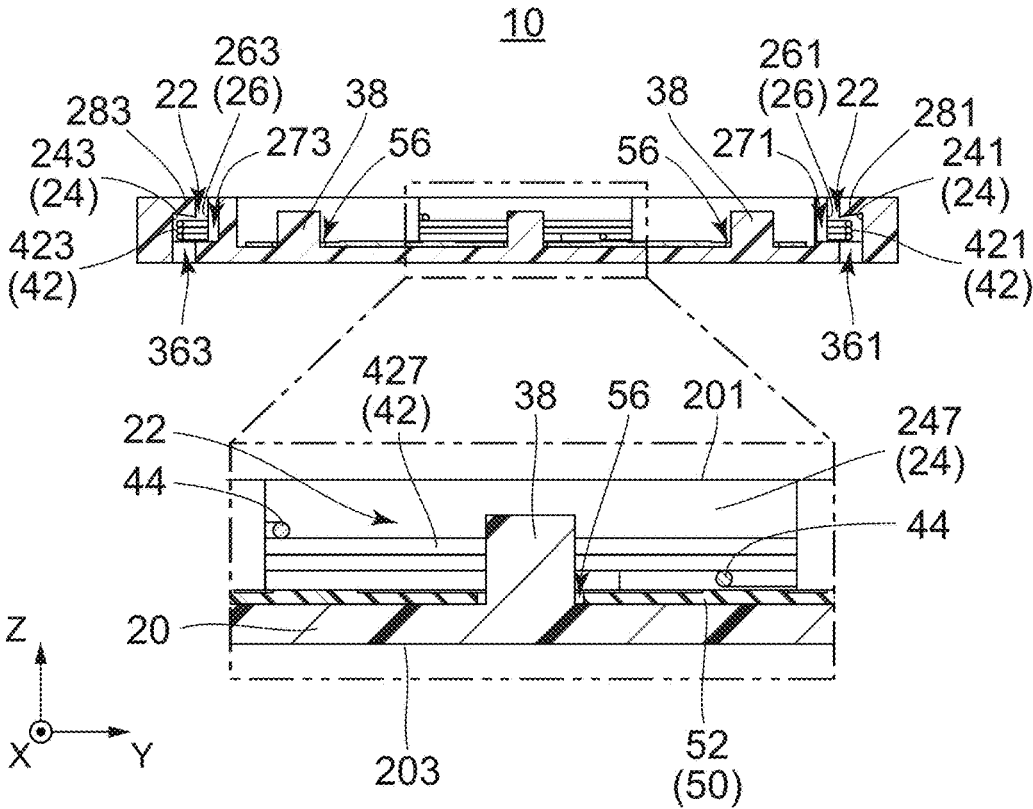
FIG. 11 is a cross-sectional view showing the antenna module of FIG. 10. The sectional position corresponds to that in FIG. 5.

As understood from FIGS. 10 and 11, the FPC 50 is formed with a plurality of through holes 56. On the other hand, the supporting member 20 is formed with a plurality of holding portions 38 corresponding to the through holes 56, respectively. The shape of each of the holding portions 38 is a cylinder at first. When the FPC 50 is attached to the supporting member 20, each of the holding portions 38 of the supporting member 20 is inserted into the through hole 56, corresponding thereto, of the FPC 50. After that, the holding portions 38 of the supporting member 20 are deformed by thermal caulking. As shown in FIG. 5, each of the holding portions 38 after deformation has an inserted portion 381 which is inserted in the through hole 56 corresponding thereto and a fixing portion 383 which is located over the inserted portion 381 and has a size larger than that of the through hole 56 in the horizontal directions. Then, by presence of the fixing portions 383, the FPC 50 is fixed to the supporting member 20.

Next, the first side portion 421 and the second side portion 423 of the main portion 42 of the coil 40 are warped inward in the second horizontal direction (the X-direction), and they are accommodated in the accommodation groove 22 of the supporting member 20 by the use of the first recess portion 271 and the second recess portion 273. When an external force is removed, the first side portion 421 and the second side portion 423 of the main portion 42 of the coil 40 try to return to the original shapes and become close to the first outer wall portion 241 and the second outer wall portion 243, respectively, to be moved under the first flange portion 281 and the second flange portion 283, respectively. At this time, the third side portion 425 of the main portion 42 of the coil 40 is located inward of the third flange portion 285 in the first horizontal direction.

Next, the coil 40 is moved in the fourth orientation (the positive X-direction) in whole using, for example, a jig. This movement of the coil 40 is made so that the third side portion 425 of the main portion 42 of the coil 40 is located under the third flange portion 285 at least in part and that the fourth side portion 427 is accommodated in the accommodation groove 22 and located under the protrusions 30 at least in part. Moreover, the movement is made so that the third side portion 425 of the main portion 42 of the coil 40 is not brought into contact with the third inner wall portion 265. In order to enable this process, in the present embodiment, a distance between the protrusions 30 and the third flange portion 285 in the first horizontal direction is shorter than a length (an outer diameter) of the main portion 42 of the coil 40 in the first horizontal direction. Moreover, a distance between the inner walls 26 of the accommodation groove 22 in the horizontal direction is shorter than an internal measurement (an internal diameter) of the main portion 42 of the coil 40 in the first horizontal direction.

Finally, the magnetic sheet 60 (see FIG. 1) is attached to the upper surface 201 of the supporting member 20. In detail, the magnetic sheet 60 is attached to the upper part of the outer wall 24 by adhesive, etc., so that is partly covers the main portion 42 of the coil 40.

As understood from FIGS. 2, 6 and 8, in the antenna module 10 finished, the lead portion 54 of the FPC 50 passes under the coil 40 to be laid out to the outside of the supporting member 20 through the opening portion 249. With this structure, although the coil 40 is located above the lead portion 54 of the FPC 50 in part, the main portion 42 of the coil 40 does not receive a force from the lead portion 54 directly. This is because the fourth outer wall portion 247 of the outer wall 24 restricts deformation and movement of the lead portion 54. Accordingly, when the antenna module 10 is mounted on a substrate (not shown), for example, even if the lead portion 54 is deformed or moved by an external force, the main portion 42 of the coil 40 is not moved in the accommodation groove 22 or does not come out from the accommodation groove 22. Moreover, since the movement of the main portion 42 of the coil 40 is restricted, positional relationship between the main portion 42 of the coil 40 and the magnetic sheet 60 is maintained.

As understood from FIG. 9, a part of the main portion 42 of the coil 40 is located under each of the first flange portion 281 and the second flange portion 283 when viewed from above. With this structure, it is prevented or suppressed that the main portion 42 of the coil 40 moves in the accommodation groove 22 or comes out from the accommodation groove 22. As a result, as understood from FIG. 4, even if the antenna module 10 is mounted on the substrate (not shown) in any orientation, a distance between the main portion 42 of the coil 40 and the magnetic sheet 60 is kept constant. For example, even if the antenna module 10 is mounted on the substrate upside down, the distance between the main portion 42 of the coil 40 and the magnetic sheet 60 is kept constant. Thus, the antenna having desired antenna characteristics module can be obtained.

As understood from FIG. 9, in the present embodiment, a part of the main portion 42 of the coil 40 is located under each of the third flange portion 285 and the protrusions 30 when viewed from above. Similarly to the first flange portion 281 or the second flange portion 283, each of the third flange portion 285 and the protrusions 30 prevents or suppresses the movement of the main portion 42 of the coil 40 to maintain the positional relationship between the main portion 42 of the coil 40 and the magnetic sheet 60. In this way, the antenna module with the desired antenna characteristics can be obtained with greater certainty.

Although the specific explanation about the present invention is made above with reference to concrete embodiments, the present invention is not limited thereto but susceptible of various modifications and alternative forms without departing from the spirit of the invention. For example, although the magnetic sheet 60 covers approximately half of the upper surface 201 of the supporting member 20 in the aforementioned embodiment, the present invention is not limited thereto. The magnetic sheet 60 may cover the whole of the upper surface 201 of the supporting member 20.

This application is based on a Japanese Patent Application of JP2023-192242 filed with the Japanese Patent Office on Nov. 10, 2023, the contents of which are incorporated herein in their entirety by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

REFERENCE SIGNS LIST

10 Antenna Module
20 Supporting Member
201 Upper Surface
203 Lower Surface
22 Accommodation Groove
24 Outer Wall
241 First Outer Wall Portion
243 Second Outer Wall Portion
245 Third Outer Wall Portion
247 Fourth Outer Wall Portion
249 Opening Portion
26 Inner Wall
261 First Inner Wall Portion
263 Second Inner Wall Portion
265 Third Inner Wall Portion
267 Fourth Inner Wall Portion
271 First Recess Portion
273 Second Recess Portion
275 Third Recess Portion
28 Flange Portion 281 First Flange Portion
283 Second Flange Portion
285 Third Flange Portion
30 Protrusion
32 Rib
34 Hollow
361 First Confirmation Window
363 Second Confirmation Window
365 Third Confirmation Window
38 Holding Portion
381 Inserted Portion
383 Fixing Portion
40 Coil
42 Main Portion
421 First Side Portion
423 Second Side Portion
425 Third Side Portion
427 Fourth Side Portion
44 End Portion
50 Flexible Printed Circuit Board (FPC)
501 Conductive Pattern
52 Connection Portion
54 Lead Portion
56 Through Hole
60 Magnetic Sheet

The invention claimed is:

1. An antenna module comprising a supporting member, a coil, a flexible printed circuit board and a magnetic sheet, wherein:
   the coil has a main portion and end portions;
   the end portions are connected to the flexible printed circuit board;
   the flexible printed circuit board has a lead portion;
   the supporting member has an outer wall and an inner wall which form an accommodation groove and has at least one first flange portion and at least one second flange portion;
   the at least one first flange portion protrudes from the outer wall in a first orientation perpendicular to an up-down direction;
   the at least one second flange portion protrudes from the outer wall in a second orientation which is opposite to the first orientation;
   the main portion of the coil is accommodated in the accommodation groove at least in part;
   the lead portion of the flexible printed circuit board is laid out to an outside of the supporting member in part in a third orientation perpendicular to the up-down direction and perpendicular to both the first orientation and the second orientation;
   a part of the main portion of the coil is located under each of the first flange portion and the second flange portion when viewed from above; and
   the magnetic sheet is attached to an upper part of the outer wall so that the magnetic sheet covers partly the main portion of the coil.
2. The antenna module as recited in claim 1, wherein:
   the supporting member further has at least one third flange portion protruding from the outer wall in the third direction; and
   a part of the main portion of the coil is located under the third flange portion when viewed from above.
3. The antenna module as recited in claim 1, wherein:
   the supporting member is provided with an opening portion communicating with the accommodation groove;

the opening portion is formed in a lower part of the outer wall; and the lead portion passes under the coil and passes through the opening portion to be laid out to the outside of the supporting member.

4. The antenna module as recited in claim 1, wherein:

the coil is located above the lead portion in part;

the supporting member further has two protrusions protruding from the outer wall in a fourth orientation opposite to the third orientation;

the two protrusions are located at positions which sandwich the lead portion; and a part of the main portion of the coil is located under each of the two protrusions when viewed from above.

5. The antenna module as recited in claim 1, wherein:

the inner wall of the supporting member is provided with a first recess portion and a second recess portion;

the first recess portion and the second recess portion correspond to the first flange portion and the second flange portion, respectively;

the first recess portion is located at a side of the first orientation with respect to the first flange portion corresponding thereto and recessed in the first orientation; and the second recess portion is located at a side of the second orientation with respect to the second flange portion corresponding thereto and recessed in the second orientation.

6. The antenna module as recited in claim 1, wherein:

the supporting member has an upper surface formed with the accommodation groove and a lower surface opposite to the upper surface; and the lower surface is formed with a plurality of ribs intersecting with one other and hollows each of which is sandwiched by adjacent two of the ribs.

7. The antenna module as recited in claim 1, wherein:

the supporting member has an upper surface formed with the accommodation groove and a lower surface opposite to the upper surface; and the lower surface is formed with a confirmation window which allows visual confirmation that the coil is accommodated in the accommodation groove.

8. The antenna module as recited in claim 1, wherein:

the flexible printed circuit board is formed with a plurality of through holes;

the supporting member is formed with a plurality of holding portions corresponding to the through holes; and each of the holding portions has an inserted portion which is inserted into the through hole corresponding thereto and a fixing portion which is located on the inserted portion and has a size larger than a size of the through hole in a horizontal direction perpendicular to the up-down direction.

9. The antenna module as recited in claim 1, wherein:

the first flange portion has a shape which goes down as the shape goes in the first orientation in a cross section defined by the first orientation and the up-down direction; and the second flange portion has a shape which goes down as the shape goes in the second orientation in a cross section defined by the second orientation and the up-down direction.

* * * * *